(12) United States Patent
Zhang et al.

(10) Patent No.: US 6,816,015 B2
(45) Date of Patent: Nov. 9, 2004

(54) AMPLIFIER CIRCUIT HAVING A PLURALITY OF FIRST AND SECOND BASE RESISTORS

(75) Inventors: Shuyun Zhang, Brookline, MA (US); Robert Jeffery McMorrow, Concord, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/400,774

(22) Filed: Mar. 27, 2003

(65) Prior Publication Data

US 2004/0189396 A1 Sep. 30, 2004

(51) Int. Cl.$^7$ .................................................. H03F 3/68
(52) U.S. Cl. .................. 330/295; 330/124 D; 330/296; 330/285
(58) Field of Search ............................ 330/295, 124 D, 330/296, 285

(56) References Cited

U.S. PATENT DOCUMENTS

| | | | |
|---|---|---|---|
| 3,510,735 A | 5/1970 | Potter | |
| 3,577,092 A | 5/1971 | Kubicz | |
| 3,766,449 A | 10/1973 | Bruchez | |
| 3,860,460 A | 1/1975 | Olson | |
| 3,969,752 A | 7/1976 | Martin et al. | |
| 3,977,020 A | 8/1976 | Enzlin et al. | |
| 3,986,058 A | 10/1976 | Hongu et al. | |
| 3,990,092 A | 11/1976 | Yoshimura | |

(List continued on next page.)

FOREIGN PATENT DOCUMENTS

| | | |
|---|---|---|
| GB | 2 140 204 A | 11/1984 |
| JP | 55-165672 | 12/1980 |
| JP | 56160113 | * 12/1981 |

OTHER PUBLICATIONS

Liang et al. "Geometry and Bias Current Optimization for SiGe HBT Cascode Low–Noise Amplifiers," IEEE Radio Frequency Integrated Circuits (RFIC) Symposium 2002 Jun. 2–4, 2002 pp 407–410.*
Paul Horowitz and Winfield Hill, The Art of Electronics 70 (Cambridge Univ. Press 1980).
Shuyun Zhang et al., An Advanced Power Amplifier Module for Quad–Band Wireless Applications, (manuscript, on file with Analog Devices, Inc.).
William Liu et al., *The Use of Base Ballasting to Prevent the Collapse of Current Gain in AlGaAs/GaAs Heterojunction Bipolar Transistors*, 43(2) IEEE Transactions on Electron Devices 245 (Feb. 1996).
M. Gat et al., *A 4.0 Watt High Efficiency 15–18 GHZ POWER–MMIC*, 1991 IEEE Microwave & Millimeter– Wave Monolithic Circuits Symp. 93.

*Primary Examiner*—Michael B. Shingleton
(74) *Attorney, Agent, or Firm*—Iandiorio & Teska

(57) ABSTRACT

An improved bipolar transistor power amplifier circuit including a bias input node, an RF input node, an RF output node, and a plurality of HBTs. Each HBT includes a base, an emitter, a collector, a base resistor connected to the base and selected to offset a portion of the voltage drop across the base and emitter of each transistor, an emitter resistor connected to the emitter, and a base capacitor having two electrodes one of which is coupled to the base. The HBTs are grouped together in two or more groups and each group includes a base resistor selected to offset another portion of the voltage drop across the base and emitter of the transistors. The base resistors are coupled to the bias input node, the collectors of each HBT are coupled to the RF output node, and the other electrode of each base capacitor is coupled to the RF input node resulting in a power amplifier with HBT base resistors which do not have to be large enough to provide all of the thermal protection and do not have to dissipate as much power resulting in a more compact layout.

13 Claims, 2 Drawing Sheets

U.S. PATENT DOCUMENTS

| | | |
|---|---|---|
| 4,124,823 A | 11/1978 | Sechi |
| 4,131,908 A | 12/1978 | Daub et al. |
| 4,183,020 A | 1/1980 | Schade, Jr. |
| 4,417,265 A | 11/1983 | Murkland et al. |
| 4,631,495 A | 12/1986 | Mueller et al. |
| 4,686,557 A | 8/1987 | Mahrla |
| 4,725,876 A | 2/1988 | Kishi |
| 4,728,902 A | 3/1988 | Gleason et al. |
| 5,066,926 A | 11/1991 | Ramachandran et al. |
| 5,109,262 A | 4/1992 | Kadota et al. |
| 5,111,269 A | 5/1992 | Tsugaru |
| 5,132,764 A | 7/1992 | Bayraktaroglu |
| 5,214,394 A | 5/1993 | Wong |
| 5,233,310 A | 8/1993 | Inoue |
| 5,274,342 A | 12/1993 | Wen et al. |
| 5,321,279 A | 6/1994 | Khatibzadeh et al. |
| 5,352,911 A | 10/1994 | Grossman |
| 5,422,522 A | 6/1995 | Rotay |
| 5,608,353 A | 3/1997 | Pratt |
| 5,629,648 A * | 5/1997 | Pratt .......................... 330/296 |
| 5,760,457 A | 6/1998 | Mitsui et al. |

* cited by examiner

AMPLIFIER CIRCUIT HAVING A PLURALITY OF FIRST AND SECOND BASE RESISTORS

FIELD OF THE INVENTION

This invention relates to an amplifier circuit useful, among other things, in wireless devices such as cellular telephones to amplify radio frequency signals.

BACKGROUND OF THE INVENTION

Amplifier circuits are used, among other things, to amplify a radio frequency (RF) signal within a wireless device such as a cellular telephone or personal data assistant. It is known in the art to construct such an amplifier circuit from a number of heterojunction bipolar transistors (HBTs) and also known that HBTs suffer from thermal runaway. See U.S. Pat. Nos. 5,629,648, 5,321,279 and 5,608,353 incorporated herein by this reference. In the '648 and '353 patents, the amplifier circuit includes a number of amplifiers each including an HBT with an emitter coupled to ground, a base, a collector, a base resistor, and a base capacitance in the form of a special segmented capacitor for each HBT to reduce the chances of thermal runaway.

Because the emitters of each HBT are coupled directly to ground, there is no emitter ballasting even though that technique is known to also reduce thermal runaways. See the '648 patent, col. 1, lines 43–50.

In the '279 patent, ballast impedances are added to the bases of an HBT but again, emitter ballasting is not provided for. Other relevant art includes U.S. Pat. No. 5,760,457 and the articles "The Use of Base Ballasting to Prevent the Collapse of Current Gain in ALGaAs/GaAs HBTs", W. Lui, et al., IEEE Transactions on Electronic Devices, Vol. 43, No. 2, February 1996; "Handbook of III–IV HBTs", W. Lui, John Wiley and Sons, 1998; and "Horowitz and Hill: The Art of Electronics", Paul Horowitz, Winfield Hill, Cambridge University Press, NY, N.Y. 1980, also included herein by this reference.

Employing both base and emitter ballasting for the HBTs in accordance with the prior art typically requires a large area circuit resulting in high fabrication costs.

SUMMARY OF THE INVENTION

It is therefore an object of this invention to provide an amplifier with base ballasting and also, preferably, emitter ballasting to fully address thermal runaway.

It is a further object of this invention to provide such an amplifier at a lower cost.

It is a further object of this invention to provide such an amplifier which does not require a large circuit area.

This invention results from the realization that, by grouping HBTs, ballasting is better effected: each HBT has a base resistor selected to offset a portion of the voltage drop across the base and emitter of each transistor and each group of HBTs also has a base resistor selected to offset another portion of the voltage drop so that the base resistor of each HBT does not have to be large enough to provide all of the thermal protection and does not have to dissipate as much power resulting in a more compact layout.

This invention features an improved bipolar transistor power amplifier circuit comprising a bias input node, an RF input node, an RF output node, and a plurality of HBTs. Each HBT includes a base, an emitter, a collector, a base resistor connected to the base and selected to offset a portion of the voltage drop across the base and emitter of each transistor, an emitter resistor connected to the emitter, and a base capacitor having two electrodes one of which is coupled to the base.

The HBTs are grouped together in two or more group each group including a second base resistor selected to offset another portion of the voltage drop across said base and emitter of the transistors. The second base resistors coupled to the bias input node, the collectors of each HBT coupled to the RF output node, and the other electrode of each base capacitor coupled to the RF input node resulting in a power amplifier with HBT base resistors which do not have to provide all of the thermal protection and which do not have to dissipate as much power resulting in a more compact layout.

In one example, there are also two or more third base resistors each connected to a subset of the second base resistors and selected to offset another portion of the voltage drop across said base and emitter of the transistors. In the same example, there is also a resistance in series with a capacitance between the RF input node and the bases of each HBT.

The emitter resistors are optional. Thus, this invention also features an improved bipolar transistor power amplifier circuit comprising a bias input node, an RF input node, an RF output node, a plurality of HBTs each including a base, an emitter, a collector, a base resistor connected to the base and selected to offset a portion of the voltage drop across the base and emitter of each transistor, and a base capacitor having two electrodes one of which is coupled to the base. The HBTs are grouped together in two or more groups, each group including a second base resistor selected to offset another portion of the voltage drop across the base and emitter of the transistors, the second base resistors are coupled to the bias input node, the collectors of each HBT are coupled to the RF output node, and the other electrode of each base capacitor coupled to the RF input node.

The base capacitors are also optional as long as an RF feed network is included that provides high DC isolation between cells while enabling RF energy to be effectively transmitted. Thus, this invention also features an improved bipolar transistor power amplifier circuit comprising a bias input node, an RF input node, an RF output node, a plurality of HBTs each including a base, an emitter, a collector, and a base resistor connected to the base and selected to offset a portion of the voltage drop across the base and emitter of each transistor.

The HBTs grouped are together in two or more groups, each group including a second base resistor selected to offset another portion of the voltage drop across said base and emitter of the transistors. The second base resistors are coupled to the bias input node, and the collectors of each HBT coupled to the RF output node.

In the broadest sense, this invention features a plurality of transistors each comprising a base, an emitter, a collector, and a base resistor connected to the base and selected to offset a portion of the voltage drop across the base and emitter of each transistor. The transistors are grouped together in two or more group, each group including a second base resistor selected to offset another portion of the voltage drop across the base and emitter of the transistors.

This invention also features a method of ballasting the transistors of a power amplifier circuit, the method comprising providing base ballasting for each transistor and selecting a base resistor to offset a portion of the voltage drop across the base and emitter of each transistor, grouping the transistors into two or more groups, and providing additional base ballasting for each group and selecting a base resistor for each group to offset the remaining portion of the voltage drop across the base and emitter of the transistors.

In another example, the method of this invention features adding a base resistor to the base of each transistor and selected to offset a portion of the voltage drop across the base and emitter of each transistor, adding an emitter resistor to the emitter of each transistor, adding a base capacitor having two electrodes one of which is coupled to the base of each transistor, grouping the transistors together in two or more groups, adding a base resistor for each group selected to offset another portion of the voltage drop across the base and emitter of the transistors, connecting the base resistors to a bias input node, connecting the collectors of each transistor to an output node, and connecting the other electrode of each base capacitor to an input node.

BRIEF DESCRIPTION OF THE DRAWINGS

Other objects, features and advantages will occur to those skilled in the art from the following description of a preferred embodiment and the accompanying drawing, in which.

DISCLOSURE OF THE PREFERRED EMBODIMENT

Figure 1:
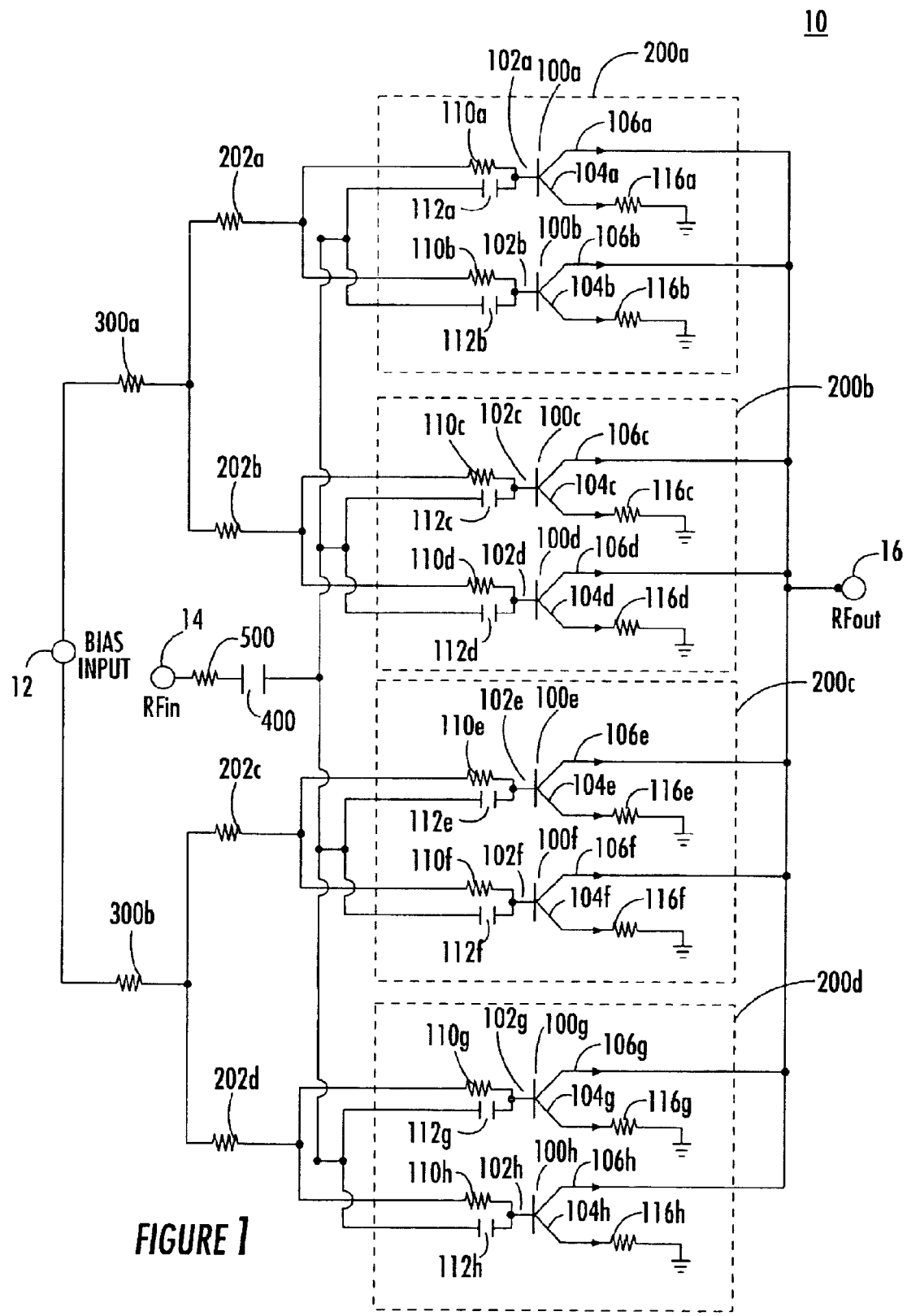
FIG. 1 is a circuit diagram showing eight HBT's grouped in four groups in accordance with the subject invention.

This invention features a novel InGaP Heterojunction Bipolar Transistor (HBT) circuit 10, FIG. 1 with a distributed RF signal feed network and a negative thermal feedback network. The exemplary circuit includes a DC bias network, a DC block network, input RF signal feed, base ballasting network and an emitter ballasting network. One unique feature of the circuit of this invention is that it provides effective base ballasting and also, in the preferred embodiment, emitter ballasting for thermal stability, compact negative feedback for electrical stability, and competitive layout area for the integrated circuit design when compared with a traditional HBT circuit. In one example, circuit 10 is used as a last stage transistor in an RF power amplifier.

In the preferred embodiment, circuit 10 includes bias input node 12, RF input node 14, and RF output node 16. There are a plurality of HBTs (typically hundreds) although in FIG. 1 only eight HBTs 100a–100h are shown. Each HBT has a base 102, emitter 104 and collector 106. There is a base resistor 110 connected to the base 102 of each HBT and selected to have a value which offsets a portion of the voltage drop across the base and emitter of each HBT and to partially prevent thermal runaway of each HBT. As shown, the HBTs are grouped together in two or more groups 200a–d. Again, it is to be understood that an actual amplifier would include many such groups, hundreds or more. And, there may be more than two HBTs per group. Moreover, it is not a necessary limitation of the subject invention that the number of HBTs per group be the same for each group. Thus, FIG. 1 is highly schematic and presented for explanation only.

For each group 200, there is a second base resistor 202a–d selected to have a value which offsets another portion (e.g., the remaining portion) of the voltage drop across the base and emitter of each individual HBT. In this way, by distributing the base ballasting, the base resistors 110 of each HBT provide both base ballasting and RF stability while the group base resistors 202 provide the DC bias to each group of HBTs, isolate the RF signal from the bias network, and improve overall stability. Thus, each base resistor 110a–h does not have to be large enough to provide all of the thermal protection and does not have to dissipate as much power resulting in a more compact design and a more compact layout compared to the case where there are no group base resistors.

In the specific example shown, there may optionally be additional base resistances 300a–b each connected to a subset of the second base resistances 202 and selected to offset the remaining voltage drop, if any, across the base and emitters of each HBT transistor. All the base resistances are coupled to bias input node 12 as shown.

In the preferred embodiment, there are also base capacitors 112a–h, one for each HBT transistor and having two electrodes one of which is coupled to the base of each HBT as shown, the other of which is coupled to RF input node 14. These capacitors are used to block DC current and inject the RF input signal to each HBT. Base capacitances 112a–h, however, are optional as long as an RF feed network is included that provides high DC isolation between cells while enabling RF energy to be effectively transmitted. Also shown is capacitance 400 and resistance 500 in series connecting the bases of each HBT to RF input 14. Capacitance 400 blocks the DC current and injects the RF input signal to each group of HBTs and resistance 500 provides RF stability. These, however, are also optional features of the invention.

Figure 2:
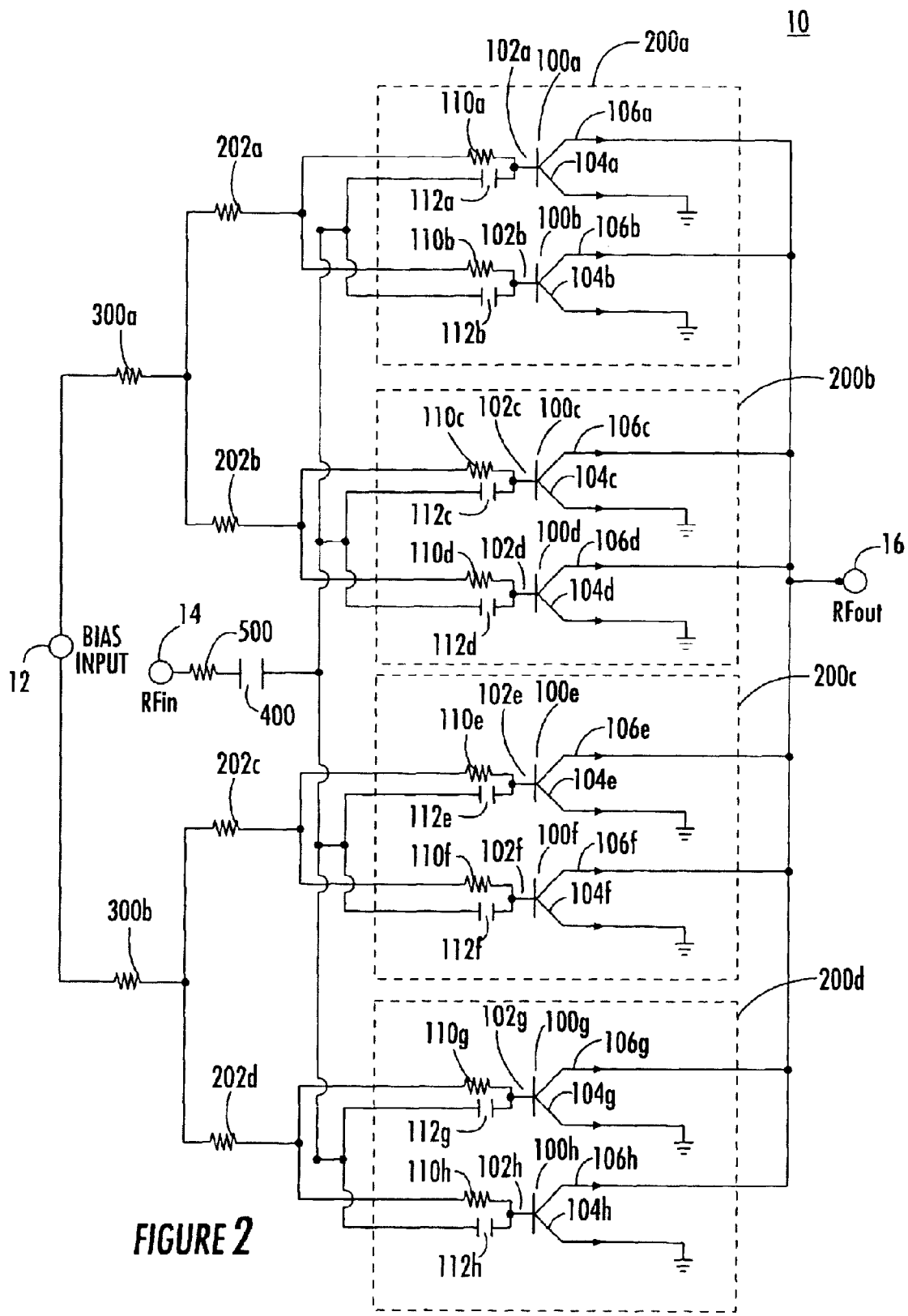
FIG. 2 is a circuit diagram similar to FIG. 1 but without emitter ballasting.

It is also preferred that each emitter has an emitter resistor 116 for emitter ballasting. Typically, the emitter resistor is inserted between each emitter and ground and is provided to improve the thermal stability of the HBT and thus plays the same roll as the base ballast resistors. The more resistance put into the emitter, the more effective the emitter resistor is. However, a high emitter resistance can cause output power and power-added-efficiency (PAE) to decrease, which is not desirable for some applications. Accordingly, FIG. 2 shows a circuit without emitter ballasting. Finally, the collectors 106 of each HBT are coupled to RF output node 16.

Thus, in one embodiment of this invention, the resistors 110a–h are primarily for base ballasting between the HBT's and resistors 116 are for emitter ballasting between and inside each HBT. As the collector current increases, the emitter current increases and the junction temperature increases. If thermal instability occurs at any emitter finger, emitter current through resistances 116 and base current through resistances 110 and 300 will increase, and thus the voltage drop will increase across resistors 116 and resistances 110 and 300 resulting in less voltage across the emitter-base junction of each HBT. This, will in turn lower the current through that HBT and effectively stabilize the output stage HBT. The ballasting resistance effectively increases for the hot finger that draws more current.

In this way, the invention advantageously combines base and emitter ballasting to form a basic HBT cell. Advantages of the invention include a smaller layout area, smaller emitter ballast resistors to keep high output power and PAE, and smaller base resistors 110a–h for base bias. This invention can also be implemented using the techniques suggested in the Application filed on an even date herewith entitled "AMPLIFIER CIRCUIT" incorporated herein by this reference. The split base and emitter resistors used in that technique have the advantage of almost doubling the effective thermal protection for little or no increase in size.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. An improved bipolar transistor power amplifier circuit comprising:
    a bias input node;
    an RF input node;
    an RF output node;
    a plurality of HBTs each including:
        a base,
        an emitter,
        a collector,
        a base resistor connected to the base and selected to offset a portion of the voltage drop across the base and emitter of each transistor,
        an emitter resistor connected to the emitter, and
        a base capacitor having two electrodes one of which is coupled to the base;
    the HBTs grouped together in two or more group each group including:
        a second base resistor selected to offset another portion of the voltage drop across said base and emitter of the transistors;
    the second base resistors coupled to the bias input node;
    the collectors of each HBT coupled to the RF output node; and
    the other electrode of each base capacitor coupled to the RF input node.

2. The amplifier circuit of claim 1 further including two or more third base resistors each connected to a subset of the second base resistors and selected to offset another portion of the voltage drop across said base and emitter of the transistors.

3. The amplifier circuit of claim 1 further including a resistance in series with a capacitance between the RF input node and the bases of each HBT.

4. An improved bipolar transistor power amplifier circuit comprising:
    a bias input node;
    an RF input node;
    an RF output node;
    a plurality of HBTs each including:
        a base,
        an emitter,
        a collector,
        a base resistor connected to the base and selected to offset a portion of the voltage drop across the base and emitter of each transistor, and
        a base capacitor having two electrodes one of which is coupled to the base;
    the HBTs grouped together in two or more group, each group including:
        a second base resistor selected to offset another portion of the voltage drop across the base and emitter of the transistors;
    the second base resistors coupled to the bias input node;
    the collectors of each HBT coupled to the RF output node; and
    the other electrode of each base capacitor coupled to the RF input node.

5. The amplifier circuit of claim 4 further including emitter resistors connected to the emitter of all or some of the HBTs.

6. An improved bipolar transistor power amplifier circuit comprising:
    a bias input node;
    an RF input node;
    an RF output node;
    a plurality of HBTs each including:
        a base,
        an emitter,
        a collector, and
        a base resistor connected to the base and selected to offset a portion of the voltage drop across the base and emitter of each transistor,
    the HBTs grouped together in two or more groups, each group including:
        a second base resistor selected to offset another portion of the voltage drop across said base and emitter of the transistors;
    the second base resistors coupled to the bias input node; and
    the collectors of each HBT coupled to the RF output node.

7. The amplifier circuit of claim 6 further including a resistance in series with a capacitance between the RF input node and the bases of each HBT.

8. The amplifier circuit of claim 6 further including a base capacitor having two electrodes one of which is connected to the base the other of which is connected to the RF input node.

9. A plurality of transistors each comprising:
    a base;
    an emitter;
    a collector; and
    a base resistor connected to the base and selected to offset a portion of the voltage drop across the base and emitter of each transistor,
    the transistors grouped together in two or more group, each group including:
    a plurality of second base resistors one for each group, selected to offset another portion of the voltage drop across the base and emitter of the transistors.

10. A method of ballasting the transistors of a power amplifier circuit, the method comprising:
    providing base ballasting for each transistor and selecting a base resistor to offset a portion of the voltage drop across the base and emitter of each transistor;
    grouping the transistors into two or more groups; and
    providing additional base ballasting for each group and selecting a plurality of base resistors one for each group, to offset the remaining portion of the voltage drop across the base and emitter of the transistors.

11. A method of base ballasting a bipolar transistor power amplifier circuit, the method comprising:

adding a base resistor to the base of each transistor and selected to offset a portion of the voltage drop across the base and emitter of each transistor;

adding an emitter resistor to the emitter of each transistor, adding a base capacitor having two electrodes one of which is coupled to the base of each transistor, grouping the transistors together in two or more groups;

adding a base resistor for each group selected to offset another portion of the voltage drop across the base and emitter of the transistors;

connecting the base resistors to a bias input node;

connecting the collectors of each transistor to an output node; and connecting the other electrode of each base capacitor to an input node.

12. The plurality of transistors of claim 9, in which the second base resistors are coupled to a bias input node.

13. The method of claim 10, further comprising the step of coupling to a bias input node the base resistors for each group to offset the remaining portion of the voltage drop.

* * * * *